US006980010B2

(12) United States Patent
Tonouchi et al.

(10) Patent No.: US 6,980,010 B2
(45) Date of Patent: Dec. 27, 2005

(54) METHOD AND APPARATUS FOR INSPECTING WIRE BREAKING OF INTEGRATED CIRCUIT

(75) Inventors: Masayoshi Tonouchi, Suita (JP); Kodo Kawase, Wako (JP); Tomoya Hirosumi, Anjo (JP); Ryoichi Fukusawa, Otawara (JP)

(73) Assignees: Riken, Wako (JP); Aisin Seiki Kabushiki Kaisha, Kariya (JP)

( * ) Notice: Subject to any disclaimer, the term of this patent is extended or adjusted under 35 U.S.C. 154(b) by 26 days.

(21) Appl. No.: 10/760,549

(22) Filed: Jan. 21, 2004

(65) Prior Publication Data

US 2004/0246011 A1 Dec. 9, 2004

(30) Foreign Application Priority Data

Jan. 21, 2003 (JP) ............................ 2003/012550

(51) Int. Cl.[7] ........................................ G01R 31/302
(52) U.S. Cl. ........................................ 324/750
(58) Field of Search ...................... 324/73.1, 96, 158.1, 324/501, 750, 751–753; 382/141, 145, 147, 382/149, 181; 250/492.2

(56) References Cited

U.S. PATENT DOCUMENTS

| | | | | |
|---|---|---|---|---|
| 4,906,922 A | * | 3/1990 | Takahashi et al. | 324/753 |
| 5,659,244 A | * | 8/1997 | Sakaguchi | 324/752 |
| 5,701,362 A | * | 12/1997 | Koga | 382/149 |
| 6,400,165 B1 | | 6/2002 | Knox et al. | |
| 6,661,912 B1 | * | 12/2003 | Taguchi et al. | 382/145 |
| 6,717,415 B2 | * | 4/2004 | Sunter | 324/519 |
| 2003/0059966 A1 | | 3/2003 | Ellison | |

FOREIGN PATENT DOCUMENTS

| | | | | | |
|---|---|---|---|---|---|
| CA | 2020733 | | | 1/1992 | |
| JP | 61086638 | A | * | 5/1986 | G01N 21/88 |
| JP | 02022572 | A | * | 1/1990 | G01R 31/02 |
| JP | 2000-311929 | | | 11/2000 | |
| JP | 2001237377 | A | * | 8/2001 | G01R 31/02 |
| JP | 2000-036525 | | | 2/2002 | |
| JP | 2003185696 | A | * | 7/2003 | G01R 31/02 |

OTHER PUBLICATIONS

Weingarten, Kurt J., "Picosecond Optical Sampling of GaAs Integrated Circuit", I.E.E.E. Journal of Quantum Electronics, vol. 24, No. 2, Feb. 1988, pp. 198-220.

European Search Report, completed May 6, 2004.

Kiyoshi Nikawa, "Failure Analysis in Si Device Chips." IEICE Trans. Electron, vol. E77-C, No. 4, Apr. 1994, pp. 528-534.

(Continued)

*Primary Examiner*—Jermele Hollington
(74) *Attorney, Agent, or Firm*—Griffin & Szipl, P.C.

(57) ABSTRACT

An apparatus that inspects wire breaking of a semiconductor integrated circuit includes a voltage applying device (12), a light pulse source (14), a scanning device (16), an electromagnetic wave detection device (18), and a wire breaking detection device (20). The voltage applying device (12) maintains a semiconductor integrated circuit in a state where a predetermined voltage is being applied thereto. The light pulse source (14) generates an ultrashort light pulse (2). The scanning device (16) two-dimensionally scans and irradiates the two-dimensional circuit of the semiconductor integrated circuit by using the ultrashort light pulse (2). The electromagnetic wave detection device (18) detects an electromagnetic wave (3) radiated from a position irradiated with the ultrashort light pulse on the semiconductor integrated circuit. The wire breaking detection device (20) detects wire breaking of the irradiated position based on presence and absence or intensity of the electromagnetic wave.

2 Claims, 2 Drawing Sheets

OTHER PUBLICATIONS

Hideo Todokoro et al., "Electron-Beam LSI Tester." In "Semiconductor Technologies," J. Nishizawa (ed), Vo. 13, JARECT, 1984, pp. 373-382.

David H. Austin et al., "Electrooptic Generation and Detection of Femtosecond Electrical Transients." IEEE J. Quantum Elec., vol. 24, , No. 2, Feb. 1988, pp. 184-197.

* cited by examiner

METHOD AND APPARATUS FOR INSPECTING WIRE BREAKING OF INTEGRATED CIRCUIT

This application claims priority from Japanese Patent Application No. 012550/2003, filed Jan. 21, 2003, the entire disclosure of which is incorporated herein by reference.

BACKGROUND OF THE INVENTION

1. Field of the Invention

The present invention relates to a method and apparatus for inspecting wire breaking of an integrated circuit. Specifically, the present invention relates to a method and apparatus for inspecting wire breaking of an integrated circuit via space in a non-contact manner by using combination of photo excitation and the radiated electromagnetic wave detection.

2. Description of the Related Art

As an inspection apparatus for wire breaking of a semiconductor integrated circuit, an observation apparatus such as a X-ray inspection apparatus and a microscope has conventionally been known. However, both of the X-ray inspection apparatus and the microscope use a technique of visually specifying a wire breaking portion by imaging, and in this technique, it is difficult to detect a wire breaking of a minute crack at a portion such as a solder connection portion where imaging is difficult. Further, there is a fear that using of the X-ray inspection apparatus for a long time may harm the health of the operator.

On the other hand, in the most commonly used inspection method, inspection of wire breaking is performed in a voltage applied state by using a tester that directly measures a voltage. However, there are the following problems. In reality, this method cannot be applied to the inspection of wire breaking of an integrated circuit because the wire of the integrated circuit is too minute. Further, in this method, wiring for voltage detection is required because when the tester does not contact with a target wire, the inspection cannot be performed.

Besides the above-mentioned known inspection apparatuses and methods, an electron beam tester that detects a voltage of an electric wire is known as a conventional technique that is used for wire breaking inspection of an integrated circuit. For example, this technique is disclosed in the following Documents 1 and 2.

[Document 1]

K. Nikawa, "Failure Analysis in Si Device Chips", IEICE Trans. Electron., Vol. E77-C, No. 4, pp. 528–534.

[Document 2]

TODOKORO H, FUKUHARA S, KONODA T, "ELECTRON-BEAM LSI TESTER", JAPAN ANNUAL REVIEWS IN ELECTRONICS COMPUTERS & TELECOMMUNICATIONS, vol. 13, pp. 373–382 (1984).

In addition, wire breaking malfunction detection apparatuses for a semiconductor integrated circuit (disclosed in the following Documents 3 and 4) have already been applied for a patent.

[Document 3]

Japanese Laid-Open Patent Publication No. 2000-311929.

[Document 4]

Japanese Laid-Open Patent Publication No. 2000-36525.

According to "Wire Breaking Malfunction Detection Apparatus and Wire Breaking Malfunction Detection Method for Semiconductor Integrated Circuit" disclosed in Document 3, in an integrated circuit manufacturing process, an electron beam injection is performed on a wafer that has undergone one process, from the side at which a wiring layer is formed. Alternatively, electrical charge is used that is generated by mutual interaction between plasma and a wafer surface in the manufacturing process and that is generated on the side at which electrical wires are formed. In these manners, an electric field is generated in a diffusion layer. Then, a laser beam injection is performed from the back side of the substrate so that photoelectric effect detection device can detect a phase and intensity change of the reflection light of the laser beam caused by a change of the generated electrical field. By the detected phase and intensity change of the reflection light, it is possible to specify the wire having wire breaking malfunction.

According to "Wire Breaking Malfunction Detection Apparatus and Method for Semiconductor Integrated Circuit, and Storage Medium" disclosed in Document 4, a power source line voltage having a shape of a pulse is applied to a power source line of an inspection target LSI, a grounded line voltage that has a shape of a pulse and of which phase is shifted by 180 degrees from the phase of the power source line voltage is applied to a grounded line, and a signal line voltage that is constant is applied to a signal line. This LSI is irradiated with an electron beam, and amounts of secondary electrons emitted from the LSI during a period T1 immediately after the power source line voltage rises and during a period $T_2$ immediately after the power source line voltage falls are detected. Based on these detection results, a voltage image in a malfunction state (of which brightness becomes different at the forward and backward sides of the wire breaking position when the wire breaking exists), and a voltage image in a normal state (of which brightness does not become different at the forward and backward sides of the wire breaking position even when the wire breaking exists) are formed. Then, the voltage image in the malfunction state and the voltage image in the normal state are alternately displayed on a displaying device.

Furthermore, another technique related to the present invention is disclosed in Document 5.

[Document 5]

D. H. Auston and M. C. Nuss, "ELECTROOPTIC GENERATION AND DETECTION OF FEMTOSECOND ELECTRICAL TRANSIENTS", IEEE JOURNAL OF QUANTUM ELECTRONICS, volume 24, pp. 184–197 (FEB. 1988), Publisher: IEEE-INST ELECTRICAL ELECTRONICS ENGINEERS INC, NEW YORK, IDS No.: M6712, ISSN: 0018-9197.

In the case of the above-mentioned electron beam testers of Documents 1 and 2, and the wire breaking malfunction detection apparatus of Documents 3 and 4, an electron beam generation source is needed, and the electron beam irradiation needs to be performed on an integrated circuit set in a vacuum chamber. Accordingly, there is a problem in that the apparatus becomes expensive, and the size of the apparatus becomes large.

SUMMARY OF THE INVENTION

In order to solve the above problems, the present invention was made. It is an object of the present invention to provide an integrated circuit wire breaking inspection apparatus and method in which wire breaking caused by a minute crack of a semiconductor integrated circuit can be detected in a non-contact manner, there is not a fear of harming operator's health, an expensive and large apparatus such as an electron beam generation source and a vacuum chamber is not required, wire breaking can be detected via air in a short time, and the apparatus of the present invention can be downsized and manufactured at low cost.

According to the present invention, there is provided a method for inspecting wire breaking of a semiconductor integrated circuit in a non-contact manner, comprising the steps of:

maintaining a semiconductor integrated circuit (1) in a state where a predetermined voltage is being applied thereto;

two-dimensionally scanning and irradiating a two-dimensional circuit of the semiconductor integrated circuit by using an ultrashort light pulse (2);

detecting an electromagnetic wave (3) radiated from a position irradiated with the ultrashort light pulse on the semiconductor integrated circuit; and detecting wire breaking of the irradiated position based on presence and absence or intensity of the electromagnetic wave.

Further, according to the present invention, there is provided an apparatus that inspects wire breaking of a semiconductor integrated circuit, comprising:

a voltage applying device (12) that maintains a semiconductor integrated circuit in a state where a predetermined voltage is being applied thereto;

a light pulse source (14) that generates an ultrashort light pulse (2);

a scanning device (16) that two-dimensionally scans and irradiates a two-dimensional circuit of the semiconductor integrated circuit by using the ultrashort light pulse (2);

an electromagnetic wave detection device (18) that detects an electromagnetic wave (3) radiated from a position irradiated with the ultrashort light pulse on the semiconductor integrated circuit; and a wire breaking detection device (20) that detects wire breaking of the irradiated position based on presence and absence or intensity of the electromagnetic wave.

According to the method and apparatus of the present invention, the semiconductor integrated circuit (1) to which a voltage is being applied is irradiated with an ultrashort light pulse (2) so that an electromagnetic wave having different intensity is radiated in accordance with a voltage applied state at the irradiated position. Then, the electromagnetic wave detection apparatus (18) detects the electromagnetic wave (3) generated when the semiconductor integrated circuit to which the predetermined voltage is being applied is irradiated with an ultrashort light pulse (2), so that with the minimum space resolution of the light wavelength, it becomes possible to two-dimensionally detect a wire breaking position via space in a non-contact manner.

Further, when detecting the electromagnetic wave (3), the scanning device (16) causes the ultrashort light pulse (2) to two-dimensionally scan the semiconductor integrated circuit. Thereby, it is possible to obtain a two-dimensional image of the circuit wire based on the generated electromagnetic wave (3). If there is wire breaking in the circuit, the intensity of the electromagnetic wave (3) from the wire breaking position becomes different from the intensity of the electromagnetic wave (3) from the wire part beyond (past) the wire breaking position, so that it is possible to two-dimensionally detect the wire breaking position.

According to a preferred embodiment of the present invention, the ultrashort light pulse (2) has a wavelength equal to or larger than 300 nanometers and equal to or smaller than 2 microns, time average energy equal to or larger than 0.1 mW and equal to or smaller than 10 W, and a pulse width equal to or larger than 1 femtosecond and equal to or smaller than 10 picoseconds.

When the ultrashort light pulse has a wavelength smaller than 300 nanometers, time average energy smaller than 0.1 mW, or a pulse width smaller than 1 femtosecond, the intensity of the generated electromagnetic wave is weak, and it becomes difficult to detect wire breaking. Meanwhile, when the ultrashort light pulse (2) has a wavelength larger than 2 microns, time average energy larger than 10 W, or a pulse width larger than 10 picoseconds, the laser intensity is too strong, so that the semiconductor integrated circuit (1) can be damaged.

Further, according to a preferred embodiment of the present invention, the light pulse source (14) is a mode lock Ti-sapphire laser or femto-second fiber laser capable of generating the ultrashort light pulse (2) that has a wavelength equal to or larger than 300 nanometers and equal to or smaller than 2 microns, time average energy equal to or larger than 0.1 mW and equal to or smaller than 10 W, and a pulse width equal to or larger than 1 femtosecond and equal to or smaller than 10 picoseconds.

By using the mode lock Ti-sapphire laser or femto-second fiber laser, it is possible to generate the above-described ultrashort light pulse (2).

Other objects and advantages of the present invention will become apparent from the following description with reference to the attached drawings.

DESCRIPTION OF THE PREFERRED EMBODIMENTS

Figure 1:
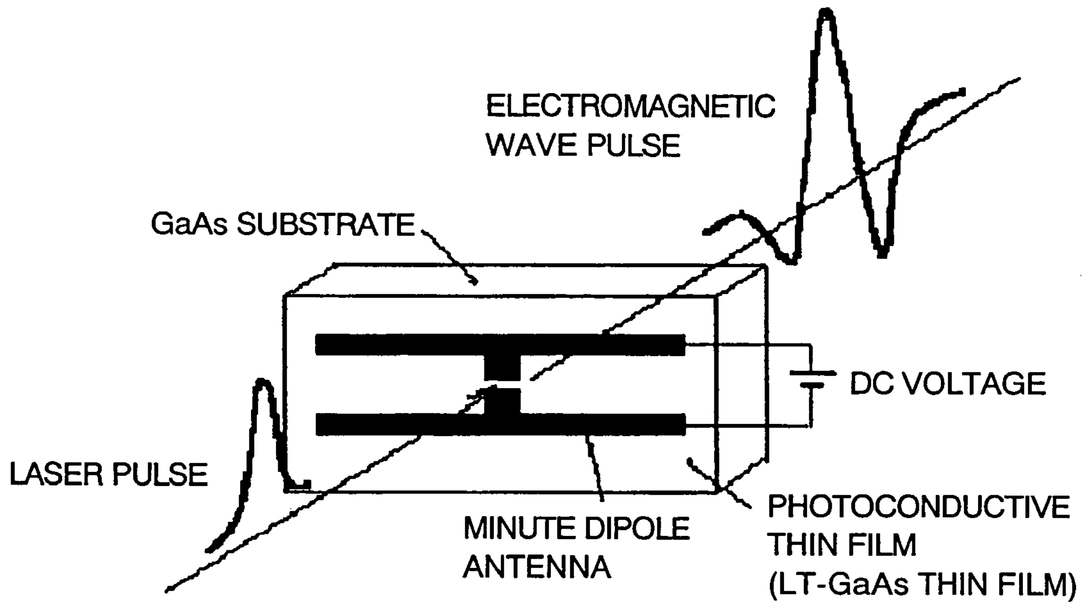
FIG. 1 shows a principle of the present invention.

In the following, a preferred embodiment of the present invention will be described with reference to the drawings. In respective drawings, the same reference numeral is assigned to a common part, and the overlapping description is omitted.

FIG. 1 is a principle illustration of the present invention showing a semiconductor optical switch configuration disclosed in the above-mentioned Document 5. In this semiconductor optical switch configuration, a semiconductor optical switch is irradiated with an ultrashort light pulse so that electromagnetic wave of which frequency reaches terahertz region (frequency of $10^{12}$ Hz) can be emitted from the semiconductor optical switch into air. This technique was developed by D. H. Auston et al in United States in 1988.

In FIG. 1, a low temperature growing (LT-)GaAs thin film that functions as a photoconductive film is made to grow on a semi-insulating GaAs substrate. Further, An antenna configuration having a gap of about 5 microns is formed by a gold alloy on the low temperature growing (LT-)GaAs thin film. LT-GaAs is generally used as a photoconductive thin film in which electric current flows at the moment a light pulse is made to enter there. The gold alloy portions also function as electrodes, and are connected to a direct current power source. A protruding center part of the gold alloy portion functions as a minute dipole antenna. When the gap between the protruding center parts is irradiated with a laser light to excite the gap part, carriers are energized from a valence band to a conductive band. The energized carriers are accelerated by the applied voltage, and then eased. The movement of the carriers is regarded as a momentary current, and thus a pulse electromagnetic wave having intensity proportional to differentiation of the momentary current with respect to time is generated.

In the above-described semiconductor optical switch configuration, the waveform of the generated electromagnetic wave on the time axis is transformed by Fourier transformation so that the frequency component (waveform on the frequency axis) of the electromagnetic wave can be obtained. Accordingly, by using an ultrashort light pulse, the generated electromagnetic wave comes to have a high frequency component that reaches a tera-hertz region.

Figure 2:
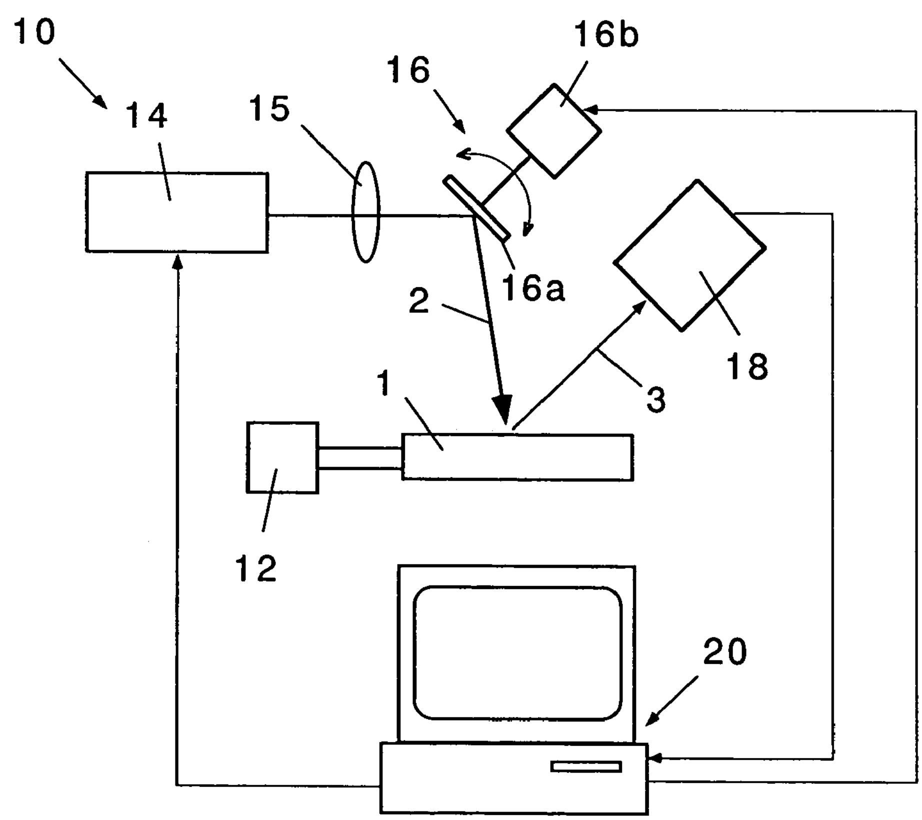
FIG. 2 is a schematic view showing wire breaking detection apparatus for a semiconductor integrated circuit according to an embodiment of the present invention.

FIG. 2 is a schematic illustration showing an integrated circuit wire breaking inspection apparatus according to an embodiment of the present invention. As shown in this drawing, the integrated circuit wire breaking apparatus 10 includes a voltage applying device 12, a light pulse source 14, a scanning device 16, an electromagnetic wave detection device 18, and a wire breaking detection device 20.

The voltage applying device 12 is a current circuit, and applies a voltage to an inspection target semiconductor integrated circuit 1 to retain a predetermined voltage applied state thereof. The predetermined voltage applied state means a state where a voltage (for example, DC 10 V) suitable to the semiconductor integrated circuit 1 is applied to a power source line thereof, and an earth line thereof is grounded. Accordingly, in this state, a circuit part of the semiconductor integrated circuit 1 connected to the power source line has the predetermined voltage, a circuit part of the semiconductor integrated circuit 1 connected to the earth line has an earth voltage (for example, 0 V), and a potential difference therebetween is produced.

The light pulse source 14 emits an ultrashort light pulse 2. Preferably, the light pulse source 14 is a mode lock Ti-sapphire laser or a femto-second fiber laser.

Furthermore, the ultrashort light pulse 2 preferably has a wavelength equal to or larger than 300 nanometers (300 nm=0.3 $\mu$m) and equal to or smaller than 2 microns (2 $\mu$m), time average energy equal to or larger than 0.1 mW and equal to or smaller than 10 W, a pulse width equal to or larger than 1 femtosecond (1 fs=0.001 ps) and equal to or smaller than 10 picoseconds (10 ps).

In other words, by using the short width pulse as the light source, it is possible to induce the electromagnetic wave without largely affecting the integrated circuit. The maximum pulse width that does not cause a thermal effect to the integrated circuit can be estimated as about 10 picoseconds.

When the ultrashort light pulse 2 has a wavelength smaller than 300 nanometers, time average energy smaller than 0.1 mW, or a pulse width smaller than 1 femtosecond, intensity of induced electromagnetic wave is small, so that the inspection becomes difficult. Meanwhile, when the ultrashort light pulse 2 has a wavelength larger than 2 microns, time average energy larger than 10 W, or a pulse width larger than 10 picoseconds, the laser intensity becomes too large, so that there is a fear of damaging the semiconductor integrated circuit 1.

The scanning device 16 two-dimensionally scans the two-dimensional circuit of the semiconductor integrated circuit 1 by using the ultrashort light pulse 2 to irradiate the semiconductor integrated circuit 1. In this example, the scanning device 16 includes a light focusing lens 15, a swinging mirror **16*a*, and a swinging device 16*b* that swings the swinging mirror 16*a*. The swinging movement of the swinging mirror 16*a* causes the ultrashort light pulse 2 to two-dimensionally scan and irradiate the two-dimensional circuit of the semiconductor integrated circuit 1. The present invention is not limited to this configuration, and the semiconductor integrated circuit 1 may be two-dimensionally moved so that the ultrashort light pulse 2 can scan the semiconductor integrated circuit 1**.

The electromagnetic wave detection device 18 is a magnetic wave detection bolometer or a semiconductor optical switch, for example, and detects an electromagnetic wave 3 from the position on the semiconductor integrated circuit 1 irradiated with the ultrashort light pulse 2.

The wire breaking detection device 20 detects wire breaking at the irradiated position based on the presence and absence or intensity of the electromagnetic wave 3. In this example, the wire breaking detection device 20 is a computer, and controls the light pulse source 14 and the scanning device 16. Further, by brightness or a color, the wire breaking detection device 20 displays the intensity of the electromagnetic wave 3, which is input from the electromagnetic wave detection device 18, on a position on a CRT corresponding to a position on the semiconductor integrated circuit 1. In this manner, from the intensity of the electromagnetic wave 3, the wire breaking detection device 20 displays a two-dimensional image of the circuit wiring on the CRT. This image is compared with a corresponding image obtained from a normal semiconductor integrated circuit 1. Accordingly, when wire breaking exists in the wiring, a change in the intensity of the electromagnetic wave occurs between the wire breaking position and the wiring part beyond the wire breaking position. Therefore, it is possible to two-dimensionally detect the wire breaking portion.

According to an integrated circuit wire breaking detection method of the present invention, by using the above-described integrated circuit wire breaking detection apparatus 10, a semiconductor integrated circuit 1 is maintained in the predetermined voltage applied state, the two-dimensional circuit of the semiconductor integrated circuit 1 is scanned and irradiated by the ultrashort light pulse 2, and an electromagnetic wave 3 radiated from the irradiated position of the circuit is detected. Thereby, in a non-contact manner, the wire breaking of the irradiated position is detected based on the presence and absence or intensity of the electromagnetic wave 3.

According to the above-described method and apparatus of the present invention, the semiconductor integrated circuit 1 to which a voltage is being applied is irradiated with the ultrashort light pulse 2 so that strong and weak electromagnetic wave 3 can be radiated depending on the voltage applied states of respective parts on the integrated circuit. Thus, the semiconductor integrated circuit 1 to which the predetermined voltage is being applied is irradiated with the ultrashort light pulse 2 from the outside thereof to generate the electromagnetic wave 3, and the generated electromagnetic wave 3 is detected by the electromagnetic wave detection device 18 set outside the semiconductor integrated circuit 1. Therefore, by using the light of which wavelength functioning as the minimum space resolution, it is possible to two-dimensionally detect the wire breaking portion via space (air) in a non-contact manner.

When detecting the electromagnetic wave 3, the scanning-device 16 causes the ultrashort light pulse 2 to two-dimensionally scan the semiconductor integrated circuit 1, inducing the electromagnetic wave 3. Based on the generated (induced) electromagnetic wave 3, a two-dimensional image of the circuit wiring can be obtained. When the wire breaking exists in the wiring circuit, the electromagnetic waves 3 from the wire breaking position and from the wiring part beyond the wire breaking position change in intensity, so that it is possible to two-dimensionally detect the wire breaking position.

As described above, by configuring the integrated circuit wire breaking detection apparatus that uses combination of light pulse generation and electromagnetic wave detection, it is possible to realize the novel apparatus that two-dimensionally detect wire breaking Of an integrated circuit.

Embodied Example

Figure 3A:
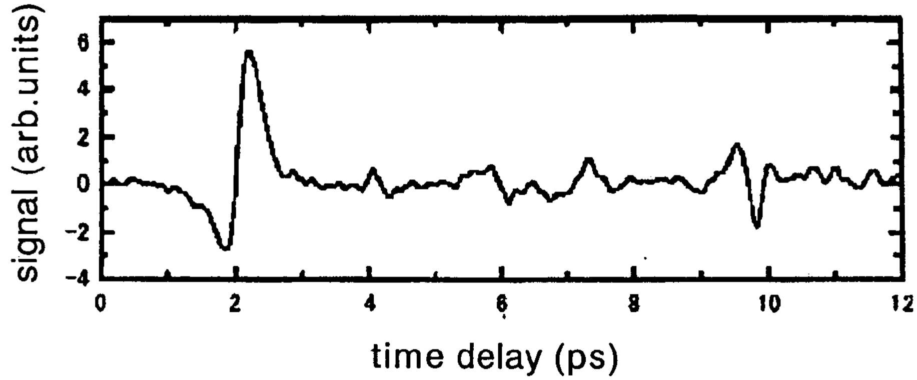
FIGS. 3A and 3B show characteristics of an electromagnetic wave according to an embodied example of the present invention.
Figure 3B:
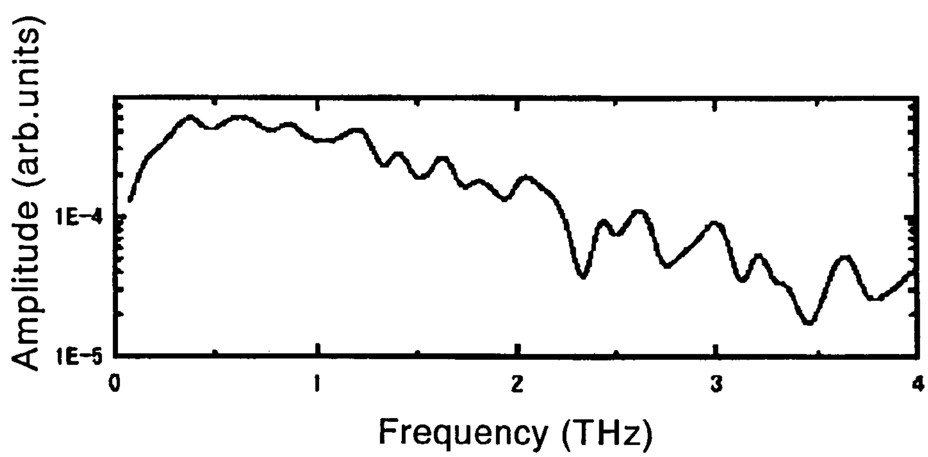

FIGS. 3A and 3B show characteristics of electromagnetic wave according to an embodied example of the present invention. FIG. 3A shows a waveform of an electromagnetic wave on the time axis generated by irradiating a semiconductor optical switch with an ultrashort light pulse having a pulse width of 50 femtoseconds. FIG. 3B shows the frequency component obtained by Fourier transformation of the waveform of the electromagnetic wave on the time axis shown in FIG. 3A.

In FIG. 3B, the horizontal axis indicates frequency, and the vertical axis indicates the intensity. From FIG. 3B, it is understood that the frequency component of the generated electromagnetic wave ranges from 0.5 THz (1 THz=$10^{12}$ Hz) to 4 THz. Accordingly, the wavelength of the generated electromagnetic wave ranges from 75 micron meter to 500 micron meter, and with a wavelength being used as the minimum space resolution, it is possible to two-dimensionally detect wire breaking via space in a non-contact manner.

Next, an embodied example of an integrated circuit wire breaking detection apparatus according to the present invention will be described in detail.

FIG. 2 (mentioned above) shows one embodied configuration example of the integrated circuit wire breaking detection apparatus according to the present invention. According to this integrated circuit wire breaking apparatus, an integrated circuit 1 to which a voltage is being applied is irradiated with a light pulse 2 to generate an electromagnetic wave 3, and the generated and radiated electromagnetic wave 3 is observed by an electromagnetic wave detection apparatus 18.

In this example, an irradiating light source 14 is a mode lock Ti-sapphire laser that is an argon ion laser induced type. The electromagnetic wave detection apparatus 18 is an indium antimonide hot electron bolometer. Alternatively, for example, a low temperature growing gallium arsenic optical switch can be used as the electromagnetic wave detection apparatus 18.

Figure 4A:
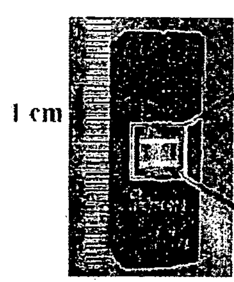
FIGS. 4A, 4B, and 4C are pictures showing the embodied example of the present invention.
Figure 4B:
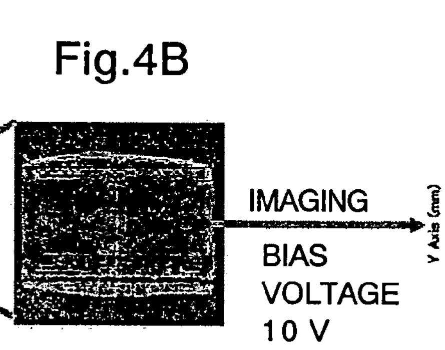
Figure 4C:
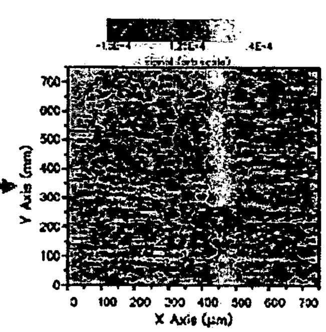

FIGS. 4A, 4B, and 4C are pictures showing the embodied example of the present invention. In these drawings, an inspection target is an integrated circuit (semiconductor device). FIG. 4A shows an entire configuration of the semiconductor device, and FIG. 4B is an enlarged view showing the center glass window part of the semiconductor device.

In this embodied example, a bias voltage of 10 V was applied to the semiconductor device, and the semiconductor device was irradiated and scanned via the center glass window by a light pulse focused to have a beam diameter of 30 μm. In this condition, the intensity distribution of the radiated electromagnetic wave was two-dimensionally detected. FIG. 4C shows a 750-μm-square area of the detected intensity distribution of the electromagnetic wave radiated from the semiconductor device.

In FIG. 4C, the white part indicates the large electromagnetic wave radiation intensity, i.e., the large potential difference.

Thus, the result shown in FIG. 4C shows that when a potential difference occurs between the wires, the intensity of the electromagnetic wave radiated from the position where the potential difference occurs becomes different from intensity of the other part. This means that intensity of an electromagnetic wave radiated from a wire breaking position becomes different from intensity of an electromagnetic wave radiated from the wire part beyond the wire breaking position in accordance with the potential difference, showing that the present invention can detect a wire breaking position.

As described above, the integrated circuit wire breaking detection method and apparatus according to the present invention can two-dimensionally detect a wire breaking position of an integrated circuit via space in a non-contact manner. Thus, it is possible to detect the wire breaking caused by a minute crack of a semiconductor integrated circuit. Therefore, there is not a fear that an inspection operation using X-rays harms the health of the operator. Furthermore, it is possible to detect wire breaking in a non-contact manner, and it is not necessary to use an expensive and large apparatus such as an electron beam source and a vacuum chamber. In addition, wire breaking can be detected via air in a short time, and it is possible to manufacture a downsized integrated circuit wire breaking apparatus at low cost.

The present invention is not limited to the above-described embodiment, and various modifications of the embodiment can be made without departing the scope of the present invention.

What is claimed is:

1. A method for inspecting wire breaking of a semiconductor integrated circuit in a non-contact manner, comprising the steps of:

maintaining a semiconductor integrated circuit in a state where a predetermined voltage is being applied thereto;

two-dimensionally scanning and irradiating a two-dimensional circuit of the semiconductor integrated circuit by using an ultrashort light pulse, wherein the ultrashort light pulse has a wavelength equal to or larger than 300 nanometers and equal to or smaller than 2 microns time average energy equal to or larger than 0.1 mW and equal to or smaller than 10 W, and a pulse width equal to or larger than 1 femtosecond and equal to or smaller than 10 picoseconds;

detecting an electromagnetic wave radiated from a position irradiated with the ultrashort light pulse on the semiconductor integrated circuit; and detecting wire breaking of the irradiated position based on presence and absence or intensity of the electromagnetic wave.

2. An apparatus that inspects wire breaking of a semiconductor integrated circuit, comprising:

a voltage applying device that maintains a semiconductor integrated circuit in a state where a predetermined voltage is being applied thereto;

a light pulse source that generates an ultrashort light pulse, wherein the li ht pulse source is a mode lock Ti-sapphire laser or femto-second fiber laser capable of generating the ultrashort light pulse that has a wavelength equal to or larger than 300 nanometers and equal to or smaller than 2 microns, time average energy equal to or larger than 0.1 mW and equal to or smaller than 10 W, and a pulse width equal to or larger than 1 femtosecond and equal to or smaller than 10 picoseconds;

a scanning device that two-dimensionally scans and irradiates a two-dimensional circuit of the semiconductor integrated circuit by using the ultrashort light pulse;

an electromagnetic wave detection device that detects an electromagnetic wave radiated from a position irradiated with the ultrashort light pulse on the semiconductor integrated circuit; and a wire breaking detection device that detects wire breaking of the irradiated position based on presence and absence or intensity of the electromagnetic wave.

* * * * *